United States Patent
Bhat

(10) Patent No.: US 8,355,422 B2
(45) Date of Patent: Jan. 15, 2013

(54) ENHANCED PLANARITY IN GAN EDGE EMITTING LASERS

(75) Inventor: Rajaram Bhat, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/493,355

(22) Filed: Jun. 11, 2012

(65) Prior Publication Data
US 2012/0244654 A1    Sep. 27, 2012

Related U.S. Application Data

(62) Division of application No. 12/789,956, filed on May 28, 2010, now Pat. No. 8,218,595.

(51) Int. Cl.
*H01S 5/00*    (2006.01)

(52) U.S. Cl. ......... 372/45.012; 372/45.011; 372/44.011; 438/31

(58) Field of Classification Search ............. 372/45.012, 372/45.011, 44.011; 438/31
See application file for complete search history.

(56) References Cited

U.S. PATENT DOCUMENTS

| | | | | |
|---|---|---|---|---|
| 4,961,197 | A | 10/1990 | Tanaka et al. | 372/45 |
| 6,156,581 | A | 12/2000 | Vaudo et al. | 438/22 |
| 6,881,983 | B2 | 4/2005 | Narayan et al. | 257/94 |
| 7,026,182 | B2 | 4/2006 | Ishikawa et al. | 438/47 |
| 7,727,874 | B2 * | 6/2010 | Hanser et al. | 438/604 |
| 7,846,757 | B2 * | 12/2010 | Farrell et al. | 438/46 |
| 8,105,919 | B2 * | 1/2012 | Chakraborty et al. | 438/478 |
| 2002/0175324 | A1 | 11/2002 | Razeghi | 257/14 |
| 2010/0260224 | A1 * | 10/2010 | Yoshizumi et al. | 372/45.01 |

OTHER PUBLICATIONS

Masselink et al, "Improved GaAs/AiGaAs single quantum wells through the use of thin superlattice buffers," Applied Physics Letters 40 (1984) p. 435.

Xu, et al, "Smoothing effect of GaAs/AlGaAs superlattices gown by metalorganic vapour phase epitaxy", Applied Physics Letters 64 (1994) p. 2949.

* cited by examiner

*Primary Examiner* — Kinam Park
(74) *Attorney, Agent, or Firm* — Bruce P. Watson; Dinsmore & Shohl LLP

(57) ABSTRACT

A GaN edge emitting laser is provided comprising a semipolar GaN substrate, an active region, N-side and P-side waveguiding layers, and N-type and P-type cladding layers. The GaN substrate defines a $20\bar{2}1$ crystal growth plane and a glide plane. The N-side and P-side waveguiding layers comprise a GaInN/GaN or GaInN/GaInN superlattice (SL) waveguiding layers. The SL layers of the N-side and P-side SL waveguiding layers have layer thicknesses between approximately 1 nm and 5 nm that are optimized for waveguide planarity. In another embodiments, planarization is enhanced by ensuring that the N-side and P-side GaN-based waveguiding layers are grown at a growth rate that exceeds approximately 0.09 nm/s, regardless of whether the N-side and P-side GaN-based waveguiding layers are provided as a GaInN/GaN SL, GaInN/GaInN SL or as bulk layers. In further embodiments, planarization is enhanced by selecting optimal SL layer thicknesses and growth rates.

4 Claims, 1 Drawing Sheet

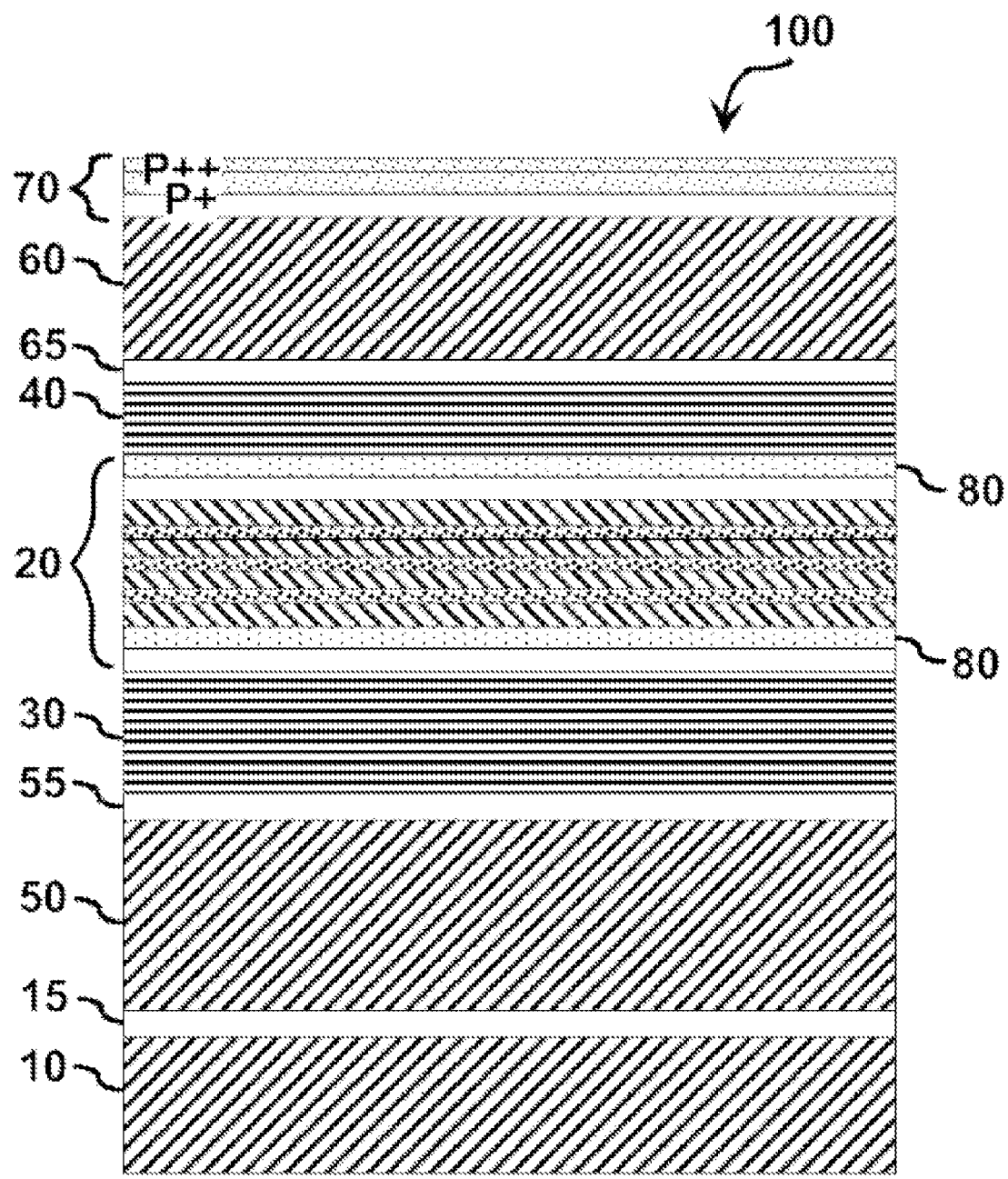

ENHANCED PLANARITY IN GAN EDGE EMITTING LASERS

CROSS-REFERENCE TO RELATED APPLICATIONS

This is a divisional of U.S. patent application Ser. No. 12/789,956 filed on May 28, 2010, now U.S. Pat. No. 8,218, 595, the content of which is relied upon and incorporated herein by reference in its entirety, and the benefit of priority under 35 U.S.C. §120 is hereby claimed.

BACKGROUND

The present disclosure relates to GaN edge emitting lasers and, more particularly, to schemes for enhancing planarity in such lasers.

BRIEF SUMMARY

The present inventors have recognized that long wavelength light emitting devices grown on semi-polar GaN substrates can exhibit increased radiative efficiency. For example, efficient green laser diodes can be grown on semi-polar $20\bar{2}1$ GaN substrates and can result in homogeneous GaInN quantum wells even at high In composition. The present inventors have also recognized that in many cases it is difficult to maintain planarity in hetero-epitaxial GaInN and AlGaInN layers grown on GaN substrates in such devices. More specifically, for many long wavelength light emitting devices grown on semi-polar GaN substrates, some of the layers, particularly those grown at low temperature and containing In, show faceting and undulation. These undulations can lead to non planar quantum wells with non uniform thickness and/or non-uniform In content. The resulting laser structure can become highly non-planar and the non-planarity of the waveguiding and cladding layers in particular can lead to excessive optical loss. In quantum wells, thickness non-uniformity and variations in the Indium content can reduce gain and broaden the emission spectrum.

In accordance with one embodiment of the present disclosure, a GaN edge emitting laser is provided comprising a semi-polar GaN substrate, an active region, an N-side waveguiding layer, a P-side waveguiding layer, an N-type cladding layer, and a P-type cladding layer. The GaN substrate defines a $20\bar{2}1$ crystal growth plane and a glide plane. The N-side and P-side waveguiding layers comprise a GaInN/GaN or GaInN/GaInN superlattice (SL) waveguiding layers. The superlattice layers of the N-side and P-side SL waveguiding layers define respective layer thicknesses that are optimized for waveguide planarity, the layer thicknesses being between approximately 1 nm and approximately 5 nm. In accordance with another embodiment of the present disclosure, planarization can be enhanced by ensuring that the N-side and P-side GaN-based waveguiding layers are grown at a growth rate that exceeds approximately 0.09 nm/s, regardless of whether the N-side and P-side GaN-based waveguiding layers are provided as a GaInN/GaN or GaInN/GaInN SL or as bulk waveguiding layers. In still further embodiments, planarization can be enhanced by selecting optimal SL layer thicknesses and growth rates.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which:

FIG. 1 is a schematic illustration of a GaN edge emitting laser according to one embodiment of the present disclosure. Variations of the illustrated embodiment are described herein without further reference to additional figures.

DETAILED DESCRIPTION

Referring initially to FIG. 1, a GaN edge emitting laser 100 is illustrated comprising a semi-polar GaN substrate 10, an active region 20, an N-side waveguiding layer 30, a P-side waveguiding layer 40, an N-type cladding layer 50, and a P-type cladding layer 60. The GaN substrate defines a $20\bar{2}1$ crystal growth plane and a glide plane. For the purposes of describing and defining the present invention, it is noted that GaN lasers are often grown on the polar plane of a GaN substrate, which imposes strong internal fields that can hamper electron-hole recombination needed for light emission. The non-polar planes, such as the m-plane and a-plane, can be used to eliminate these fields. GaN substrates can also be cut along semi-polar crystal planes, creating much weaker internal fields and allowing for a high indium concentration in the active region, which can stretch emission wavelengths to green. Particular embodiments of the present disclosure relate to growth on the $20\bar{2}1$ crystal plane of a GaN substrate, in which case the GaN substrate can be described as defining a $20\bar{2}1$ crystal growth plane. The corresponding glide plane of the GaN substrate typically extends in a direction projecting towards the c-axis of the substrate.

In the illustrated embodiment, the N-side waveguiding layer 30 and the P-side waveguiding layer 40 comprise a GaInN/GaN or GaInN/GaInN superlattice (SL) waveguiding layers. In the context of SL waveguiding layers, the superlattice layers of the N-side and P-side SL waveguiding layers 30, 40 define respective layer thicknesses that are optimized for waveguide planarity, the layer thicknesses being between approximately 1 nm and approximately 5 nm. It is also contemplated that planarization can be enhanced by ensuring that the N-side and P-side GaN-based waveguiding layers 30, 40 are grown at a growth rate that exceeds approximately 0.09 nm/s, regardless of whether the N-side and P-side GaN-based waveguiding layers 30, 40 are provided as a GaInN/GaN or GaInN/GaInN SL or as bulk waveguiding layers.

As is further illustrated, the active region 20 is interposed between, and extends substantially parallel to, the N-side SL waveguiding layer 30 and the P-side SL waveguiding layer 40. The N-type cladding layer 50 is interposed between the N-side waveguiding layer 30 and the GaN substrate 10. The P-type cladding layer 60 is formed over the P-side waveguiding layer 40. Typically, although not required, the respective compositions of the P-side SL waveguiding layer and the N-side SL waveguiding layer are substantially equivalent. In addition, in many cases, the N-side SL waveguiding layer 30 is at least as thick as the P-side SL waveguiding layer 40, with increased thickness in the N-side SL waveguiding layer 30 typically being associated with reduced optical loss.

A P-side contact structure 70 can be formed in accordance with conventional or yet to be developed teachings relevant to the construction of contacts in GaN-based lasers and is merely illustrated schematically in FIG. 1. It is also contemplated that a GaN-based buffer layer 15 can be formed over the GaN substrate 10 to assist in fabrication. In addition, current blocking layers 80 can be provided above and below the active region 20, between the active region 20 and the respective N-side and P-side waveguiding layers 30, 40, to enhance device performance. These types of laser diode components are well documented in state of the art GaN-based laser design.

It is noted that the Matthews-Blakeslee equilibrium theory, which is well documented in the art, provides predictions of the critical thickness of a strained hetero-epitaxial layer for the onset of misfit dislocations. According to the theory, relaxation via misfit dislocation generation occurs if the layer thickness exceeds the Matthews-Blakeslee critical thickness of the layer. The mathematical product of this thickness and the strain in the layer is referred to herein as the strain-thickness product of the layer. The present inventor has recognized that, for GaN-based lasers according to the present disclosure, the strain-thickness product of the N-side SL waveguiding layer 30 can be engineered to exceed its strain relaxation critical value. Further, the strain-thickness product of the N-type cladding layer 50 can be engineered to exceed its strain relaxation critical value. The resulting strain relaxation is mono-directional along the glide plane of the GaN substrate and can help enhance performance of the GaN-based laser diode. For example, in one embodiment, the strain-thickness product of the N-side SL waveguiding layer 30 exceeds its strain relaxation critical value by approximately 10%. In another embodiment, the strain-thickness product of the active region 20 is less than its strain relaxation critical value. In still further embodiments, the strain-thickness product of the N-type cladding layer 50 exceeds its strain relaxation critical value by approximately 10%.

The active region 20 may comprise barrier layers and a single quantum well layer or multi-period quantum well layers. In which case, the quantum well layers are typically between approximately 1 nm and approximately 5 nm in thickness and the barrier layers are between approximately 5 nm and approximately 30 nm in thickness. In many cases, the active region 20 comprises a single GaInN quantum well or multi-period GaInN quantum wells. In which case, the In content of the GaInN quantum wells can be tailored to be greater than the In content of the N-type SL waveguiding layer to enhance operation in the green portion of the spectral range. In still further contemplated embodiments, the active region further comprises AlGaInN barrier layers and the In content of the AlGaInN barrier layers is tailored to be less than the In content of the N-type SL waveguiding layer.

The N-type cladding layer 50 and the P-type cladding layer 60 may comprise a bulk crystal of GaN, AlGaN, or AlGaInN or a SL of AlGaN/AlGaN, AlGaN/GaN, AlGaInN/AlGaInN, AlGaInN/GaN, AlGaInN/GaInN or AlGaInN/AlGaN.

Although the GaN edge emitting laser 100 illustrated in FIG. 1 comprises an N-type GaN transition layer 55 interposed between the N-side SL waveguiding layer 30 and the N-type cladding layer 50 and a P-type GaN transition layer 65 interposed between the P-side SL waveguiding layer 40 and the P-type cladding layer 60, it is noted that these layers are not critical to the device design or operation and may be omitted.

For the purposes of describing and defining the present invention, it is noted that reference herein to a GaN laser diode should be taken to denote that the laser diode structure is grown on a GaN substrate. References herein to a GaN substrate should be taken to denote that the substrate is fabricated from high purity GaN.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Rather, the claims appended hereto should be taken as the sole representation of the breadth of the present disclosure and the corresponding scope of the various inventions described herein. Further, it will be apparent that modifications and variations are possible without departing from the scope of the invention defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of fabricating a GaN edge emitting laser comprising a semi-polar GaN substrate, an active region, an N-side waveguiding layer, a P-side waveguiding layer, an N-type cladding layer, and a P-type cladding layer, wherein:
   the GaN substrate defines a $20\bar{2}1$ crystal growth plane and a glide plane;
   the N-side waveguiding layer comprises a GaN-based superlattice or bulk waveguiding layer;
   the P-side waveguiding layer comprises a GaN-based superlattice or bulk waveguiding layer;
   the active region is interposed between and extends substantially parallel to the N-side SL waveguiding layer and the P-side SL waveguiding layer;
   the N-type cladding layer is interposed between the N-side waveguiding layer and the GaN substrate;
   the P-type cladding layer is formed over the P-side waveguiding layer;
   a strain-thickness product of the N-side SL waveguiding layer exceeds its strain relaxation critical value and a strain-thickness product of the N-type cladding layer exceeds its strain relaxation critical value such that resulting strain relaxation is mono-directional along the glide plane of the GaN substrate; and
   the N-side and P-side GaN-based waveguiding layers are grown at a growth rate that exceeds approximately 0.09 nm/s to optimize waveguide planarity.

2. A method of fabricating a GaN edge emitting laser as claimed in claim 1 wherein the growth rate at which the N-side and P-side GaN-based waveguiding layers are grown is approximately 0.095 nm/s.

3. A method of fabricating a GaN edge emitting laser as claimed in claim 1 wherein the growth rate at which the N-side and P-side GaN-based waveguiding layers are grown is between approximately 0.09 nm/s and approximately 0.10 nm/s.

4. A method of fabricating a GaN edge emitting laser as claimed in claim 1 wherein:

the N-side waveguiding layer comprises a GaInN/GaN or GaInN/GaInN superlattice (SL) waveguiding layer;

the P-side waveguiding layer comprises a GaInN/GaN or GaInN/GaInN superlattice (SL) waveguiding layer; and the superlattice layers of the N-side and P-side SL waveguiding layers are grown to define respective layer thicknesses that are optimized for waveguide planarity, the layer thicknesses being between approximately 1 nm and approximately 5 nm.

\* \* \* \* \*